United States Patent
Habermann et al.

(10) Patent No.: US 11,733,036 B2
(45) Date of Patent: Aug. 22, 2023

(54) ADAPTIVE MANUFACTURING SYSTEM

(71) Applicant: PaR Systems, LLC, Shoreview, MN (US)

(72) Inventors: Charles J. Habermann, Bloomington, MN (US); Dean R. LaValle, Centerville, MN (US); Thomas E. Marrinan, Minneapolis, MN (US)

(73) Assignee: PAR SYSTEMS, LLC, Shoreview, MN (US)

( * ) Notice: Subject to any disclaimer, the term of this patent is extended or adjusted under 35 U.S.C. 154(b) by 0 days.

(21) Appl. No.: 17/950,504

(22) Filed: Sep. 22, 2022

(65) Prior Publication Data
US 2023/0012519 A1 Jan. 19, 2023

Related U.S. Application Data

(60) Division of application No. 16/535,864, filed on Aug. 8, 2019, now Pat. No. 11,460,294, which is a
(Continued)

(51) Int. Cl.
*B25J 9/20* (2006.01)
*G05B 19/4097* (2006.01)
(Continued)

(52) U.S. Cl.
CPC ............ *G01B 21/02* (2013.01); *B23Q 3/065* (2013.01); *B25J 9/1692* (2013.01); *B25J 9/1697* (2013.01); *B25J 19/023* (2013.01); *B29C 67/0048* (2013.01); *G05B 19/404* (2013.01); *G06F 30/00* (2020.01); *B29L 2031/772* (2013.01);
(Continued)

(58) Field of Classification Search
CPC .... Y02P 90/02; B25J 9/1697; G05B 19/4097; G05B 19/404; G05B 2219/49184; G01B 21/02; B23Q 3/065; B29C 67/0048; G06F 30/00; B29L 2031/772
See application file for complete search history.

(56) References Cited

U.S. PATENT DOCUMENTS 4,947,666 A 8/1990 Hametner et al.
5,307,282 A 4/1994 Conradson et al.
(Continued)

FOREIGN PATENT DOCUMENTS

| GB | 2342187 A | 4/2000 |
|---|---|---|
| JP | H0580828 A | 4/1993 |
| KR | 101668765 B1 * | 10/2016 |

OTHER PUBLICATIONS

Adaptive Manufacturing Solution and Benefits; c 2017 PaR Systems, Inc.
(Continued)

*Primary Examiner* — Mahdi H Nejad
(74) *Attorney, Agent, or Firm* — Steven M. Koehler; Westman, Champlin & Koehler, P.A.

(57) ABSTRACT

A system and method for processing a flexible part comprising holding the flexible part securely in an unconstrained position using a holder; and controlling a positioner to process the flexible part based on a comparison of a shape and/or position of the flexible part in the unconstrained position with design specifications of the part not in the unconstrained position.

27 Claims, 8 Drawing Sheets

Related U.S. Application Data continuation of application No. 14/717,742, filed on May 20, 2015, now abandoned.

(60) Provisional application No. 62/000,635, filed on May 20, 2014.

(51) Int. Cl.

| | |
|---|---|
| *G01B 21/02* | (2006.01) |
| *B29C 67/00* | (2017.01) |
| *B23Q 3/06* | (2006.01) |
| *G05B 19/404* | (2006.01) |
| *G06F 30/00* | (2020.01) |
| *B25J 9/16* | (2006.01) |
| *B25J 19/02* | (2006.01) |
| *B29L 31/00* | (2006.01) |

(52) U.S. Cl.
CPC .............. *G05B 19/4097* (2013.01); *G05B 2219/49184* (2013.01); *Y02P 90/02* (2015.11); *Y10T 83/0304* (2015.04); *Y10T 408/03* (2015.01); *Y10T 408/55* (2015.01); *Y10T 409/303808* (2015.01); *Y10T 409/304144* (2015.01); *Y10T 409/307448* (2015.01)

(56) References Cited

U.S. PATENT DOCUMENTS

| | | | |
|---|---|---|---|
| 5,715,166 A | 2/1998 | Besl et al. | |
| 6,167,607 B1 | 1/2001 | Pryor | |
| 6,278,457 B1 | 8/2001 | Bernardini et al. | |
| 7,194,378 B2 * | 3/2007 | Gorsch | G01B 21/045 |
| | | | 702/155 |
| 7,720,573 B2 | 5/2010 | Yamada et al. | |
| 8,620,627 B2 | 12/2013 | Nakhle et al. | |
| 10,748,300 B2 * | 8/2020 | Haverkamp | G01B 11/14 |
| 10,906,182 B2 | 2/2021 | Suzuki et al. | |
| 2004/0129756 A1 | 7/2004 | Zakel et al. | |
| 2005/0107920 A1 | 5/2005 | Ban et al. | |
| 2008/0300723 A1 * | 12/2008 | Ban | G05B 19/4083 |
| | | | 901/3 |
| 2009/0025199 A1 | 1/2009 | Hariki et al. | |
| 2012/0330453 A1 * | 12/2012 | Samak Sangari | B25J 15/0616 |
| | | | 700/121 |
| 2014/0012416 A1 | 1/2014 | Negishi et al. | |
| 2014/0172152 A1 | 6/2014 | Bain et al. | |
| 2014/0277713 A1 | 9/2014 | Kouno et al. | |
| 2015/0336271 A1 | 11/2015 | Spicer et al. | |
| 2016/0167247 A1 | 6/2016 | Gallagher et al. | |
| 2020/0068909 A1 | 3/2020 | Blaine et al. | |

OTHER PUBLICATIONS (Par.com-Passive, Active and Robotic Fixtures); c 2017 PaR Systems, Inc.

Elmaraghy, H., "Flexible and Reconfigurable Manufacturing Systems Paradigms", International Journal of Flexible Manufacturing Systems, Oct. 10, 2006, pp. 261-276, vol. 17.

Ratchev et al; "Error Compensation Strategy in Milling Flexible Thin-walls Parts", Journal of Materials Processing Technology, May 15, 2005, pp. 673-681, vol. 162-163.

Sanchez et al., "Analysis and Compensation of Positional and Deformation Errors Using Integrated Fixturing Analysis in Flexible Machining Parts", International Journal of Advanced Manufacturing Technology, Jan. 18, 2006, pp. 239-252, vol. 29, No. 3-4.

International Search Report and Written Opinion for corresponding International application PCT/US2015/031779, filed May 20, 2015.

Communication from the European Patent Office for European patent application No. 15727517.3, filed May 20, 2015.

* cited by examiner

ADAPTIVE MANUFACTURING SYSTEM

CROSS-REFERENCE TO RELATED APPLICATIONS

This application is a divisional and claims priority to U.S. patent application Ser. No. 16/535,864, filed Aug. 8, 2019; which claims priority to U.S. patent application Ser. No. 14/717,742, filed May 20, 2015; which claims the benefit of U.S. Provisional Patent Application Ser. No. 62/000,635, filed May 20, 2014, the contents of all being incorporated herein by reference in their entirety.

BACKGROUND

The manufacturing or processing of flexible workpieces (herein referred to also as "parts") is often a difficult task. A flexible part is a non-rigid body that has a portion, portions or the entire body of the part that deforms due to a relatively light force, such as but not limited to the force of gravity, applied thereto. Often the flexible part is made from a flexible material and/or the material is thin, which prevents the flexible part from retaining a solid rigid body. For instance, flexible parts made from a molding process can change shape, at least partially, when the parts are removed from the mold. In other words, the flexible part often does not retain the exact shape of the mold, but rather, takes a different shape when unconstrained by the mold.

By way of example, FIG. 1 illustrates an exemplary 3-dimensional portion of a flexible part 10 that includes a U-shaped center section 12 and opposed flange portions 14. Being formed of a relatively thin or lightweight material, the width of the U-shaped center section 12 can vary along its length. In this exemplary part, variance can particularly exist where a top portion of the center section 12 joins to the side portions, as represented by double arrow 16. Likewise, the angle at which the flange 14 extends from the center section represented by double arrow 24 can vary or can change along its length. These variances are merely illustrative in that an actual flexible part can experience variances in any or all degrees of freedom.

Although the part 10 is flexible, such flexible parts are often mounted or secured to another body (not shown) whereupon when mounted, the flexible part 10 and the body together may yield a substantially rigid, or at least less flexible overall structure. However, before the flexible part 10 can be secured to the body, often the flexible part 10 must be processed so as to have a specific shape of features, which without limitation, can include recesses 17, by way of example, apertures, cut outs, desired thickness at selected portions of the flexible part, etc. all pursuant to exact specifications. Such processing can include but is not limited to drilling, milling, trimming, scribing, chamfering and using any manufacturing technique such as but not limited to machining, waterjet cutting, laser or plasma cutting, etc. In addition, processing of the flexible part 10 can also include inspecting the flexible part 10 to see if the flexible part 10 meets the desired specifications. Inspection can include use of any form of inspection or measuring device such as but not limited to profilometers, offset lasers, probes and cameras to list just a few.

Commonly, known techniques for processing or manufacturing flexible parts include mounting each flexible part in a jig having holder(s) that hold the flexible part in the desired shape and position so as, for example, to replicate mounting of the flexible part to the other body. As used herein, when the flexible part is held or supported in a specific and accurate manner to maintain a specific shape throughout, the flexible part is "constrained" by the jig or holder. As appreciated by those skilled in the art, constraining the flexible part for and during processing typically requires a unique jig constructed for each flexible part to be processed. Furthermore, mounting of the flexible part on the jig can be time consuming and be prone to positional errors.

SUMMARY

This Summary and the Abstract herein are provided to introduce a selection of concepts in a simplified form that are further described below in the Detailed Description. This Summary and Abstract are not intended to identify key features or essential features of the claimed subject matter, nor are they intended to be used as an aid in determining the scope of the claimed subject matter. The claimed subject matter is not limited to the implementations that solve any or all disadvantages noted in the background.

A first aspect of the invention includes a system for processing a flexible part comprising a holder configured to hold the flexible part securely in an unconstrained position and an end effector configured to process the flexible part when held by the holder in the unconstrained position. At least one positioner is configured to support the holder or the end effector for movement. A controller is configured to control the positioner to provide relative movement between the end effector and the holder to process the flexible part, wherein movements of the positioner have been compensated based on a comparison of a shape and/or position of the flexible part in the unconstrained position with design specifications of the part not in the unconstrained position.

A second aspect of the invention is a method for processing a flexible part comprising holding the flexible part securely in an unconstrained position; and controlling a positioner to process the flexible part based on a comparison of a shape and/or position of the flexible part in the unconstrained position with design specifications of the part not in the unconstrained position.

One or more of the following features can be included in the system or method above in further embodiments thereof.

A storage device can be included having the design specifications stored on a computer readable medium of the storage device and accessed.

The shape and/or position of the flexible part in the unconstrained position can be ascertained and stored data on a computer readable medium. Commonly, the shape and/or positon is obtained using a profilometer, such as a laser, camera system and/or measuring probe. The shape and/or position data can be in the form of a plurality of scan frames, each portion corresponding to a different portion of the flexible part. The scan frames can comprise a geometric parameter with respect to a coordinate system such as value(s) alone and/or with respect to shape(s), for example, distances, such as distances between reference points; angles, such as angles represented by intersecting vectors or line segments; and/or a series of points or mathematical expression that define a geometric parameter(s) such as line segment, intersecting line segments, arcs, circles or other curved lines. The scan frames are associated with different portions of the flexible part and each scan frame corresponds to a portion at a different position with respect to the flexible part such as along a reference direction.

A controller is configured to control the positioner and can include controlling the positioner based on a comparison of one or more scan frames with one or more reference frames, the reference frames preferably based on the design specification. Typically, controlling the positioner includes determining a control path to move the positioner.

A spatial difference can exist between reference frames and scan frames. In other words, one or more reference frames will not coincide with the scan lines enough so that a comparison can be made. In such cases, an interpolation must be made of to obtain one or more interpolated reference frames and/or one or more interpolated scan frames. In such embodiments, obtaining the comparison comprises obtaining an interpolated reference frame for comparison with an existing scan frame, comparing an interpolated scan frame with an existing reference frame or comparing an interpolated reference frame and with an interpolated scan frame. A unique matrix based on associated reference frames and scan frames where either can be interpolated as discussed above.

The system and method can be used for processing of the flexible comprises at least one of drilling, milling, trimming, scribing, chamfering or inspecting. It should be noted the positioner can be coupled to the end effector to control movement thereof or coupled to the holder to control movement thereof.

DESCRIPTION OF ILLUSTRATIVE EMBODIMENT

Figure 1:
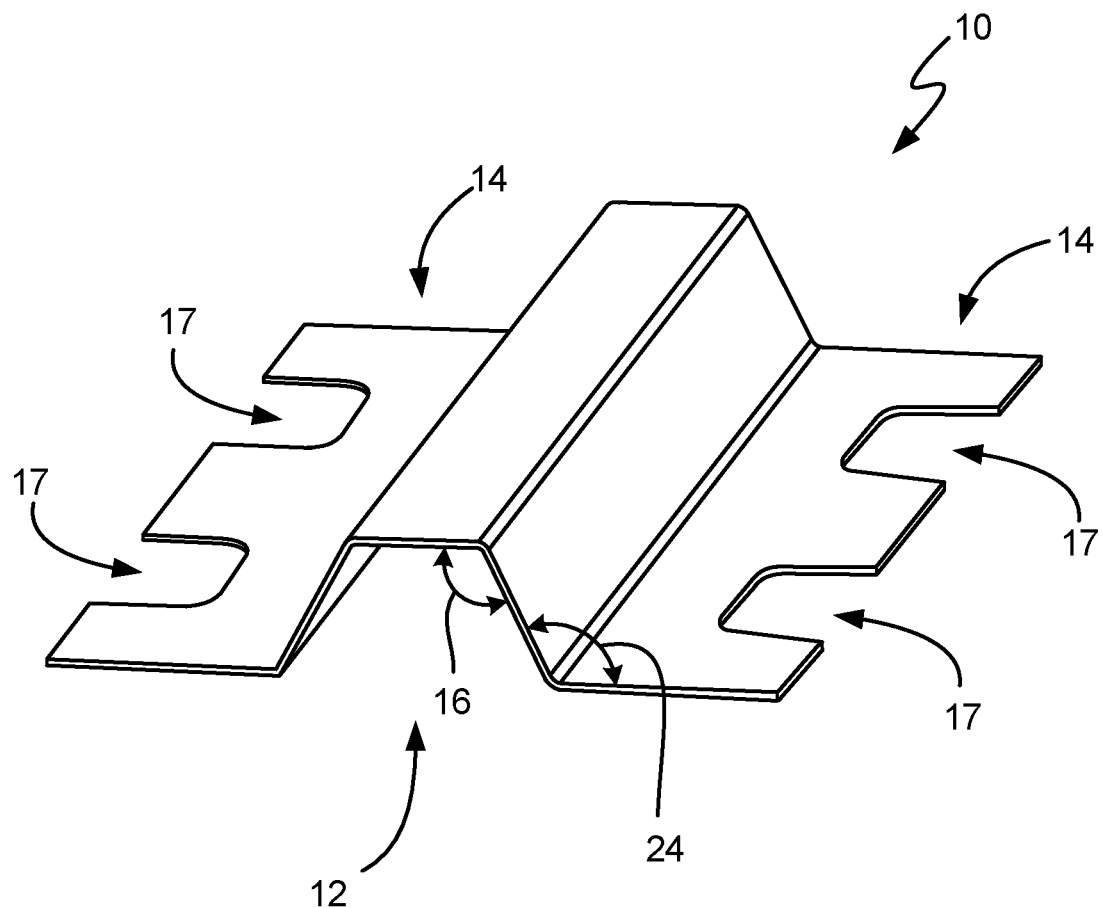
FIG. 1 is a perspective view of an exemplary part for processing.
Figure 2:
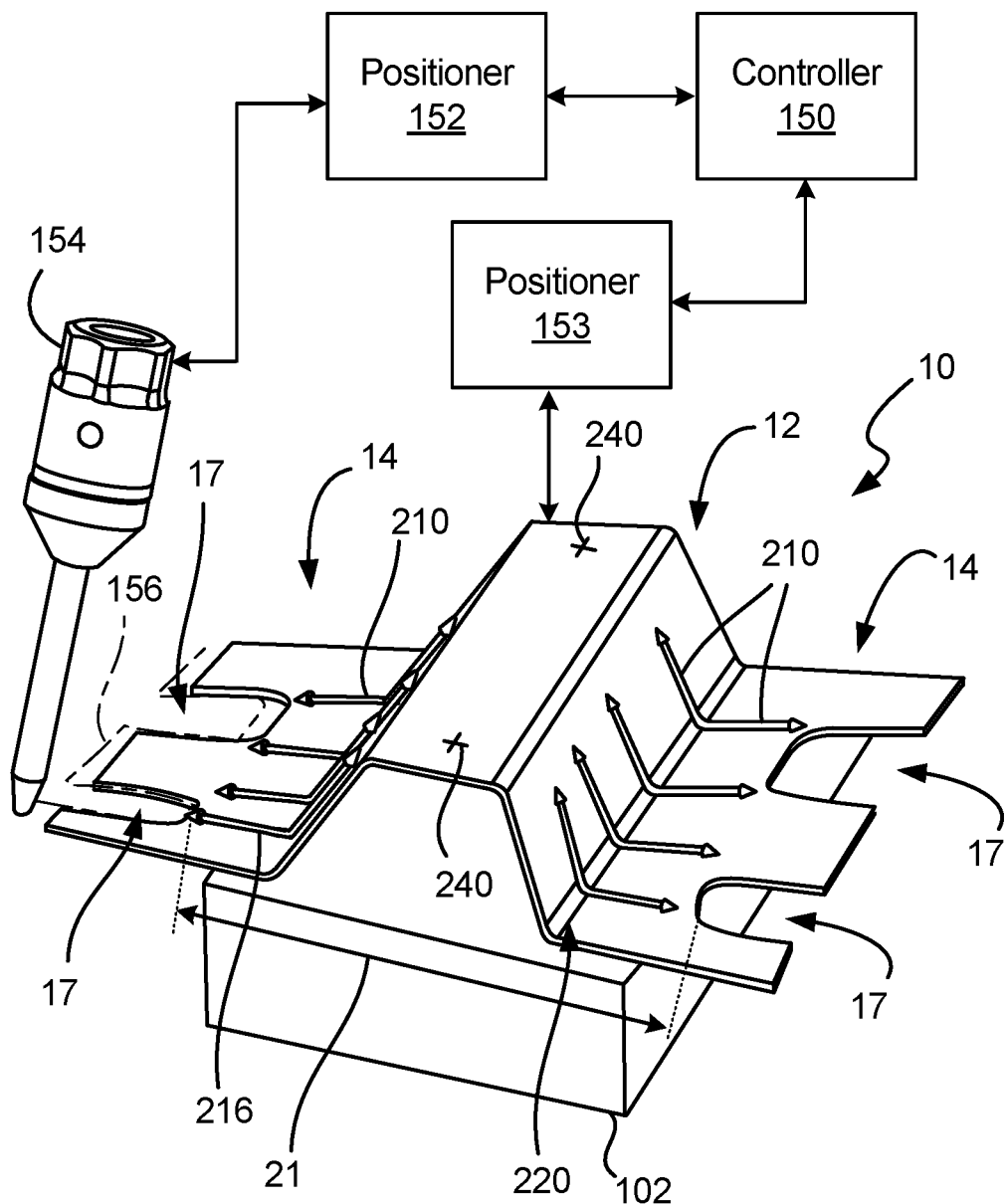
FIG. 2 is a schematic diagram of a system for processing the part of FIG. 1.

An adaptive flexible part processing system and method are described herein. Referring to FIG. 2, the system includes a jig or holder 102 that holds the flexible part 10 in an "unconstrained" manner. As used herein, "unconstrained" means that the flexible part 10 is not held in a specific and accurate manner to maintain a specific shape throughout the body of the flexible part 10, but rather held in a less exacting manner, where the shape can differ from design specifications, and typically where the extent of difference from design specification can vary throughout the flexible part 10, typically without repeatability from part to part although the parts are to be the same. "Design specifications" as used herein refer to the shape, dimensions, etc. of the flexible part 10 as used in the manner for which it intended. It is desired to process the flexible part 10 such that when used in the manner for which it intended, the flexible part 10 will change its shape, for example, so as to be mounted to another part, or in other words it changes its shape to match the design specifications such that it will properly mount to the other part.

It should be noted that the jig or holder 102 is shown schematically since the design will vary considerably depending on the part 10 to be formed or inspected. Many types of holders are known and can be used with the system and method herein described. Specific features of the holder 102 are not needed for purposes of understanding of the present invention other than that it holds the part 10 securely in any known manner, for example, via the use of clamps, fasteners, vacuum cups, magnets, fixed and/or adjustable support elements to name just a few.

Figure 3:
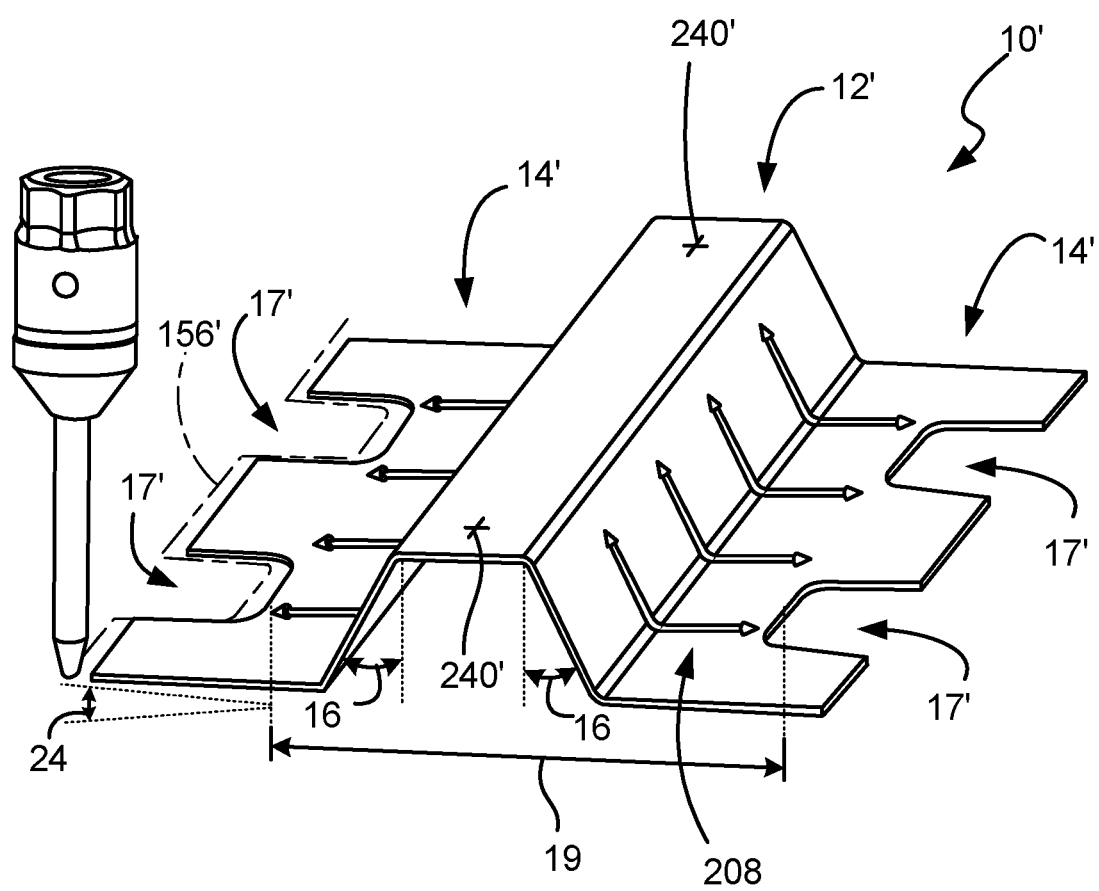
FIG. 3 is a visual representation of a virtual part defined by design specifications.

FIG. 3 represents a view of the part 10' meeting design specifications. The design specifications are often stored electronically in or on computer readable media. In other words, the design specifications of the part 10' comprise desired dimensions of the actual part 10 and are represented herein by the illustration of FIG. 3, which could correspond to a computer aided design (CAD) file or the like, viewable on a computer display or through the use of other rendering devices such as from a 2 or 3 dimensional printer, plotter, etc.

As a simple, non-limiting example suppose the design specifications of the flexible part 10' requires recesses 17' cut in each of the opposed flanges 14' to be a selected distance 19 apart from each other when fasteners are used to mount the actual flexible part 10 to another part. In addition, suppose that the design specifications require that the center section 12' joins to the flange portions 14' at a certain angle, as represented by double arrow 16, and that a certain angle is provided at which the flanges 14' extend from the center section 12' represented by double arrow 24. Since the location of the recesses 17 relative to each other control at least in part the angles 16 on each side of the actual flexible part 10 when the flexible part 10 is mounted to the other part, the position of each of the recesses 17 must be accurate. However, as indicated above it is costly and time consuming to create a special jig or holder to hold the flexible part 10 in a constrained position matching the design specifications such that the spacing between the flanges 14 match the mounting of the flexible part 10 on the other part. Using this known processing technique, only after achieving the proper constrained position of the flexible part 10 are the recesses 17, for example, then made in each of the flanges 14.

In contrast, aspects of the present invention enable a flexible part 10 to be processed accurately even though the flexible part 10 is being held in an unconstrained manner by holder 102 (i.e. held at least in a position that does not match the design specifications as represented by part 10'). In other words, unconstrained does not mean that the flexible part 10 is not held securely. To the contrary, an unconstrained flexible part 10 means the flexible part 10 is held in a manner to the extent necessary for the type of processing being performed on the flexible part 10 to be done.

It should also be noted when the flexible part is held in an unconstrained manner, it does not mean that it is held within certain tolerances that allows work or other processes to be performed on the flexible part that without further regard to its shape on the jig or holder will yield an acceptable flexible part. As will be described below, aspects of the system and method herein described allows a flexible part 10 to be held securely in an unconstrained manner, but any work upon or inspection of the flexible part 10, is performed only after taking into account the shape of the flexible part 10 on the jig or holder as it is being held in the unconstrained manner; and in particular, the variances present in the shape as it is being held due to the flexibility of at least some portions of the flexible part 10. Only after the shape of the flexible part 10 as it is being held is known, is the flexible part 10 processed where processing takes into account the unconstrained shape of the flexible part 10. Using by way of the simple example referenced above, the formation of the recesses 17 in the flanges 14, or inspection thereof, may be at a distance 21 from each other that does not match the distance 19 of the recesses 17 when the part is mounted to the other part. For example, the distance 21 between the recesses 17 may be greater, narrower and/or out of alignment when formed when the flexible part 10 is held by the holder in an unconstrained manner, but nevertheless when the flexible part 10 is mounted in the constrained position to the other part, the recesses 17 are at the distance 19 from each other as required by the design specifications such that the required angles 16 and 24 on each side of the flexible part 10 are obtained. It should be noted, the illustration of FIG. 2 depicts the part 10 as being severely out of alignment with respect to the design specifications for purposes of understanding.

The system also generally includes a controller 150 that controls a positioner 152 (typically movable in multiple degrees of freedom), where the positioner 152 commonly supports an end effector 154 for controlled movement as needed to process the flexible part 10 as desired. For example, the end effector 154 can comprise device(s) to perform drilling, milling, trimming, chamfering, etc. on or inspection of the flexible part 10 as described in the background section above.

The controller 150 provides control signals to the positioner 152 such that the end effector 154 attached thereto moves about the flexible part 10 typically according to a defined path 156 (herein also referred to as a "tool path"), a portion of which is illustrated. The controller 150, positioner 152 and end effector 154 attached to the positioner 152 are well known devices. The controller 150 can comprise analog and/or digital circuitry and is typically computer-based wherein a processor executes instructions stored therein so as to generate control signals for the positioner 152 and end effector 154. Likewise, the positioner 152 can take numerous well known forms such as but not limited to a multi-degree of freedom robotic arm or a gantry system having the end effector 154 mounted to a robotic arm or other support that is fixed or moves relative to a bridge that in turn is moveable on one or more rails. In addition, a plurality of holders 102 can be used to hold a larger part 10 where each of the holders 102 hold a portion of the part 10. A particular advantageous embodiment of a configurable system having a plurality of multi-degree of freedom arms for holding a variety of different parts is described in U.S. patent application Ser. No. 14/213,398, filed on Mar. 14, 2013 and entitled "MULTI-AXIS CONFIGURABLE FIXTURE", which is incorporated herein by reference in its entirety.

It should be noted although it is common for the positioner 152 to support the end effector 154 for controlled movement thereof relative to the flexible part 10 being held by the holder 102 held in a stationary position, in a further embodiment, a positioner 153 could be used to move the holder 102 and thus the flexible part 10 relative to the end effector 154 held in a stationary position. In yet another embodiment, separate positioners 152, 153 can be used to move both the end effector 154 and the holder 102, respectively, if desired. Hereinafter, the embodiment where the holder 102 and flexible part 10 are held stationary while the positioner 152 supports and moves the end effector 154 will be further described, nevertheless this should not be considered limiting, but rather aspects of the present invention can be applied to the other embodiments described above as well.

Generally, the system and method herein described process the flexible part 10 with the desired end effector 154 mounted to the positioner 152, where the positioner 152 is controlled so as to account for the unconstrained manner in which the flexible part 10 is held by the holder 102 in order to process the part 10 and obtain, or compare the actual part 10 to the design specifications (represented by part 10'). As will be described below, the system and method alter the actual tool path 156 to take into account the unconstrained manner in which the part 10 is held. In FIG. 3, tool path 156' is a calculated or otherwise generated or a known tool path that would be taken by the end effector 154 for a part 10' to meet the design specifications when the part is ideally held. Since the part 10' is a virtual part defined by the desired design specifications, the tool path 156' is not the actual tool path but rather a reference tool path that is used to obtain the actual tool path 156.

Figure 4:
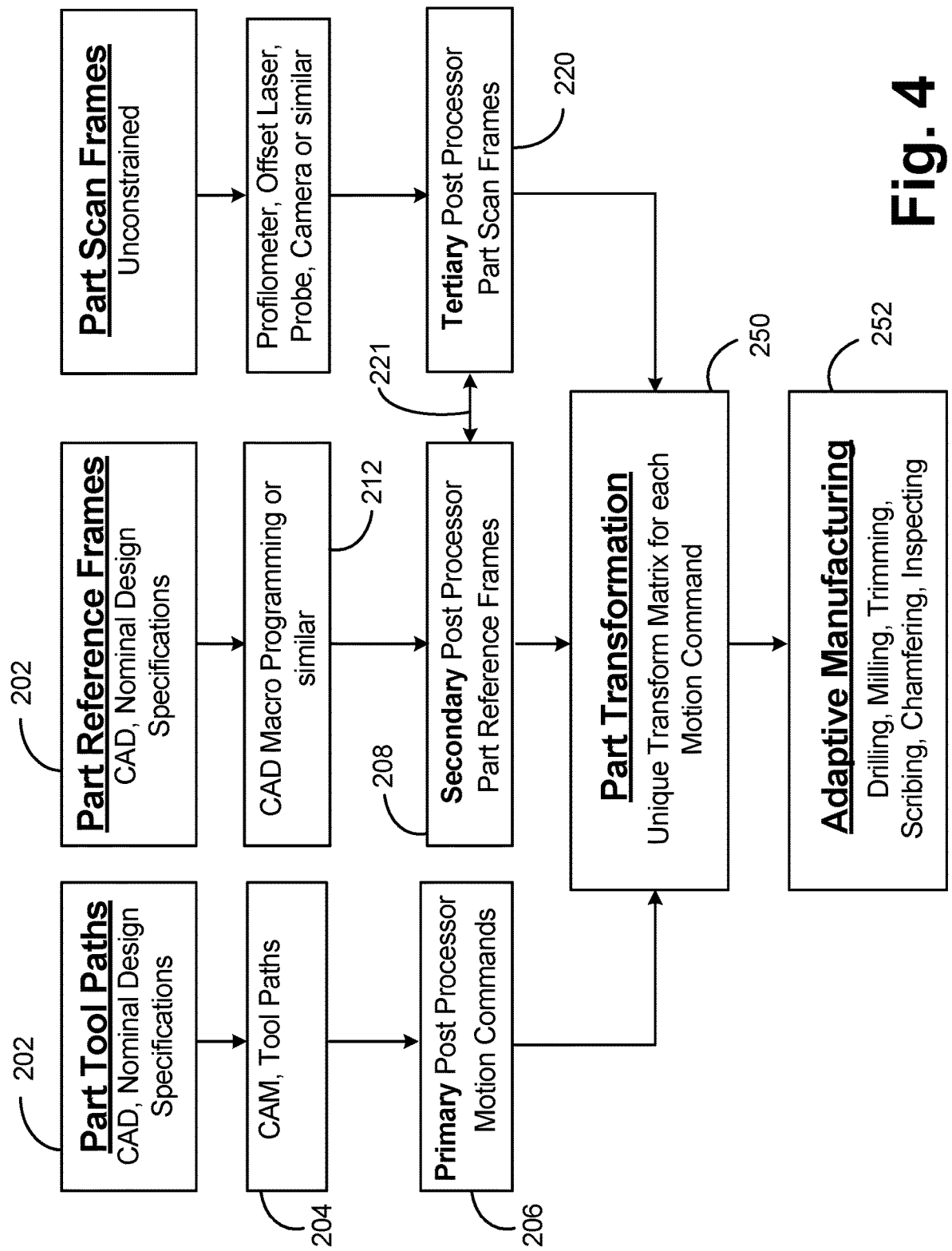
FIG. 4 is a flow diagram illustrating a method for processing the part.

FIG. 4 illustrates inputs or types of information needed and the processing to obtain the tool path 156 for processing the part 10 when held in an unconstrained manner. A first portion of information comprises the reference (nominal) tool path 156' of the part 10'. Commonly, the reference tool path 156' is derived based on the desired (nominal) design specifications, indicated at 202, which can be, for example embodied in a CAD file or the like. Using the desired design specifications 202, the reference tool path 156' can be derived from computer aided manufacturing programs or systems as indicated at 204. Commonly, the tool path 156' is then processed to generate motion control commands 206 in a form suitable to be used by or to control the positioner 152. The reference tool path 156' is illustrated in FIG. 5 where the part 10' again is illustrative of the design specifications.

A second type of information needed for obtaining the tool path 156 are reference frames based on the nominal design specifications of the part 10'. As used herein a "frame" is a portion of the part 10' or part 10 that is used as the basis of comparison between the part 10' as defined by the design specifications with the same portion found in the part 10. The frame can be any geometric parameter that is used to define a portion of the part 10' and part 10. Such parameters include but are not limited to value(s) by themselves and/or with respect to shape(s), for example, distances, such as distances between reference points; angles, such as angles represented by intersecting vectors; and/or a series of points or mathematical expression that define a geometric parameter(s) such as line segment, intersecting line segments, arcs, circles, etc. In one advantageous embodiment, the frame comprises geometric parameter(s) related to a cross-section of the part 10' or 10 along a referenced direction.

Figure 5:
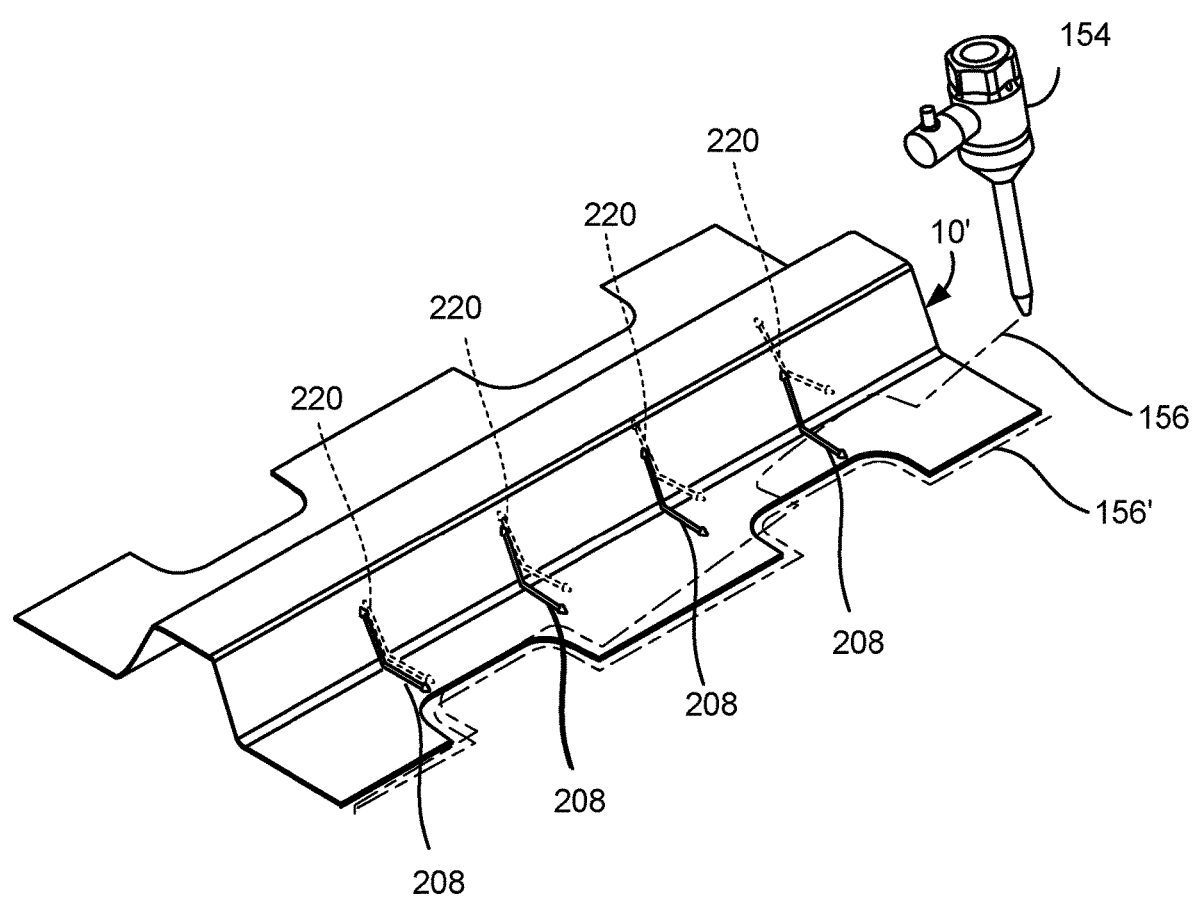
FIG. 5 is a schematic diagram pictorially illustrating processing of the part.

Referring to FIG. 5, the reference frames 208 comprise line segments 210, joined together at one end on each side of the part 10' (herein illustrated on one side by way of example) that represent the center section 12' joined to each of the opposed flanges 14'. As such, the frames are also indicative of the angles 16 and 24 of the respective portion of the part 10'. The fact that the frames 208 comprise joined line segments should not be considered limiting in that if desired the line segments or other geometric parameters can be unconnected but otherwise associated with each other. In one embodiment, each frame comprises pairs of connected line segments on each side of the center section 12' as illustrated in FIG. 3. Taken along a reference direction of the part 10', such as a longitudinal axis, the plurality of reference frames 208 define the part 10'. The plurality of reference frames 208 can be generated or derived (e.g. calculated) based on the design specifications embodied for example in the CAD file using CAD macro programming 212 or similar processing of the design specifications 202. Typically, the plurality of reference frames 208 comprise spaced apart individual frames along the reference direction of the part 10'. The spacing between adjacent frames can be selected based on the accuracy desired and/or the flexibility of the actual part 10.

A third type of information needed for obtaining the tool path 156 are frames based on the unconstrained part 10 being held. As used herein the frames 220 based on the unconstrained the part 10 are referred to as "scan frames". A plurality of scan frames 220 are best illustrated in FIG. 2. In FIG. 5 only the plurality of scan frames 220 are shown since the part 10' is illustrated rather than the actual unconstrained part 10. Typically, the scan frames 220 do not depart as significantly from the reference frames 208 as that illustrated in FIG. 5, which is done so for purposes of understanding.

Referring to FIG. 4, the scan frames 220 are obtained from measured data of the unconstrained part 10. Typical measurement devices include profilometers such as but not limited to probes, offset lasers, cameras or the like.

In many instances of processing a part, the reference frame(s) will not coincide with an actual scan frame as measured directly from the profilometer with the desired accuracy or correspondence. In one embodiment, it is advantageous to obtain scan frame data at a higher resolution in the same reference direction than that of the spacing of the reference frames 208. The higher resolution scan data allows an interpolated scan frame to be obtained, which can then be associated with the corresponding reference frame. In FIG. 5, individual reference frames of the plurality of reference frames 208 are each illustrated with a corresponding scan frame (actual or interpolated) of the plurality of scan frames 220. Processing corresponding to associating scan frames 220 with reference frames 208 in order to ascertain if interpolation is needed is indicated by double arrow 221 in FIG. 4.

Figure 6:
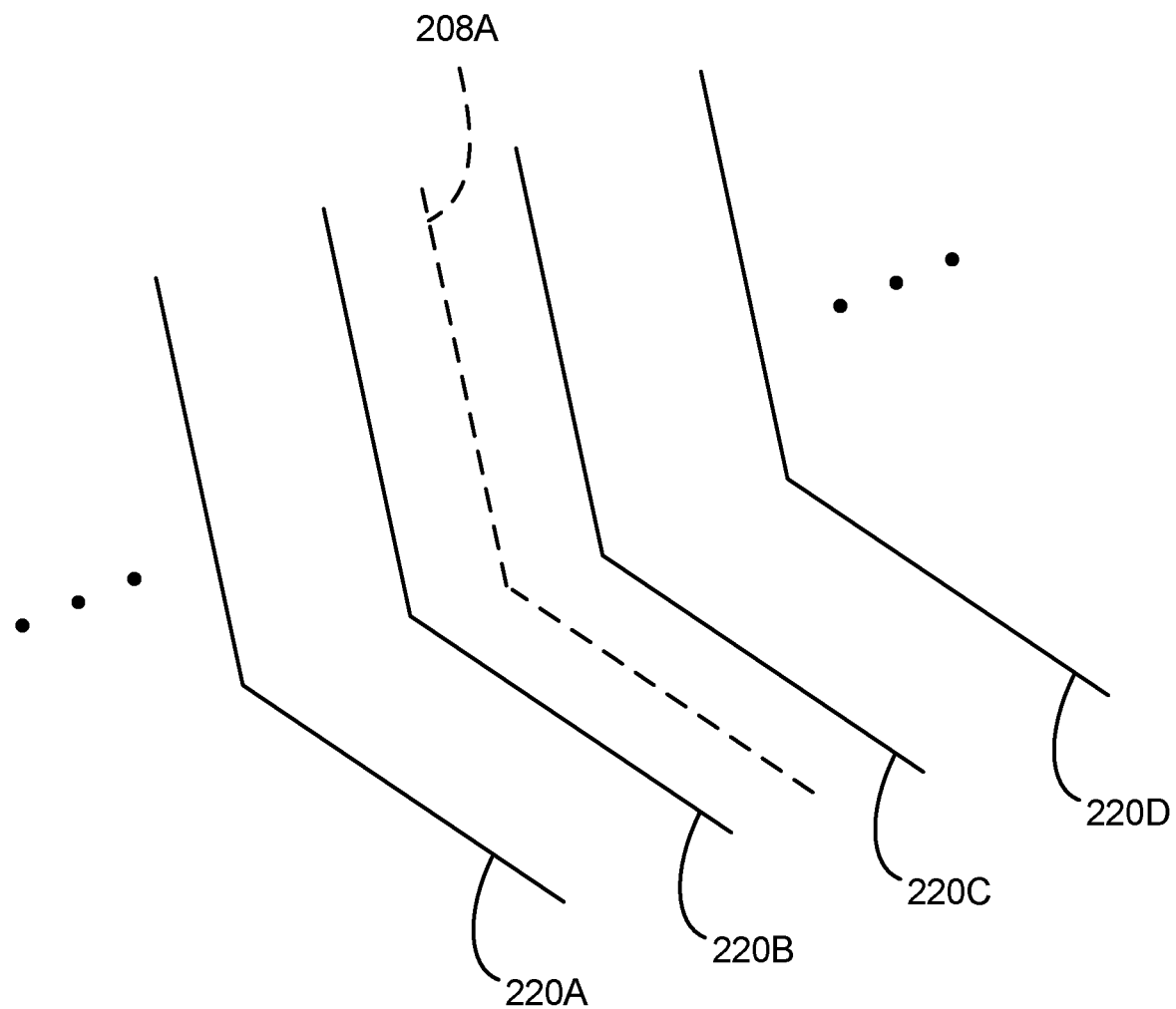
FIG. 6 is a schematic diagram of a reference frame and scan frames.

Referring to FIG. 6, a portion of a reference frame 208A associated with one side of the part 10' (not shown in FIG. 6) is illustrated with a series of portions of scan frames 220A, 220B, 220C and 220D. As illustrated, the reference frame 208A does not coincide with either of the scan frames 220B and 220C, but rather is disposed between them. In order to obtain a scan frame with the desired accuracy of association with the reference frame 208A (which will be used later), a scan frame coinciding with the reference frame 208A can be obtained through known interpolation calculations of the data associated with scan frames 220B and 220C. It should be noted either an interpolated scan frame can be obtained so as to be compared with an existing reference frame, or an interpolated reference frame can be obtained so as to be compared with an existing scan frame, or both an interpolated reference frame and an interpolated scan frame can be obtained so as to be compared with each other.

At this point it should be noted that there is commonly registration existing between the design specifications (represented by 10') and part 10. For example, the part 10 to be processed can include one or more registration elements (markings or characteristic physical portions such as a known point on the part), for example, as illustrated in FIG. 2 at 240, while the design specifications include a similar registration element(s) 240'. Using a comparison of the registration element(s) 240 of the part 10 with the registration element(s) 240' of the design specifications 10', the scan frames 220B and 220C where the reference frame 208 would be disposed can be ascertained, because the series of scan frames 220 are obtained at known intervals. It should be noted that the registration elements 240 illustrated in FIG. 2 are only illustrative in that the registration element can take many forms. Generally, the registration element(s) 240 need only be quality and/or quantity to provide the requisite information so as to understand the differences between the unconstrained actual part 10 relative to the design part 10' to enable the interpolation calculations for any and all interpolated scan lines to be accurate.

Referring back to FIG. 4, a transform matrix with respect to a suitable coordinate system (Cartesian, Polar, etc.) can be obtained for each pair of associated reference and scan frames of part 10. Each transform matrix represents the spatial difference between each associated reference and scan frame, and thus the spatial difference of the corresponding portion of part 10 with respect to the same portion of the design specifications represented by part 10'. By applying each unique transform matrix to appropriate motion commands 206, the motion commands 206 for the reference tool path 156' are spatially adjusted so as to provide motion control commands 250 that correspond to that of tool path 156, which when the end effector 154 is applied to the unconstrained part 10, will yield or correspond to an actual part meeting the design specifications for any of the exemplary adaptive manufacturing processes indicated at 252. Although illustrated in FIG. 4 where the unique transform matrices are applied to the motion commands 206, it should be understood that the unique transform matrices can be applied to the reference tool path 156', whereupon the tool path 156 for the unconstrained part 10 is then obtained. The motion commands for the positioner 152 can then be obtained from the tool path 156.

Figure 7:
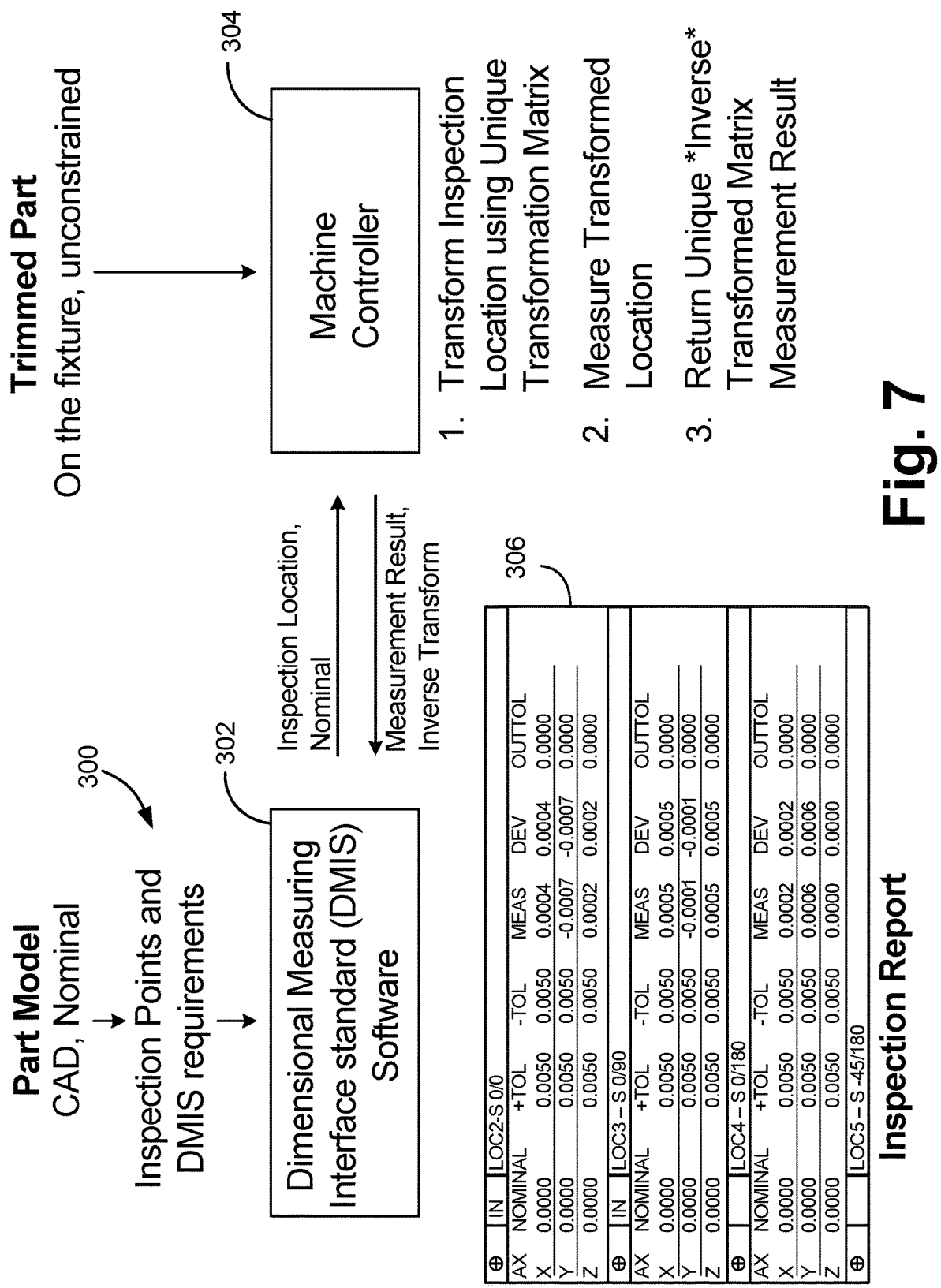
FIG. 7 is a flow diagram illustrating inspecting a part.

FIG. 7 illustrates an example of application of the foregoing to part inspection in detail. For each actual part 10 to be inspected, inspection points and Dimensional Measuring Interface Standard (DMIS) requirements 300 of nominal design specifications of a part, are provided to Dimensional Measuring Interface Standard software 302. The nominal inspection locations and the reference frames corresponding to the design specifications of the part, as discussed above, are provided to a machine controller 304. In the manner discussed above, scan frames for the part 10 to be inspected are obtained and associated with corresponding reference frames so as to obtain a plurality of unique transform matrices that in turn are used to transform the nominal inspection locations so that they can be compared with corresponding measured inspection locations as should be found on the unconstrained part 10. The measured inspection locations are then compared to calculated measured inspection locations so to realize a unique "Inverse" transformation matrix, which is returned with the measurement results to the Dimensional Measuring Interface Standard software 302. Using the foregoing information, DMIS issues an inspection report 306 for the actual part.

The processing described above can be performed on controller 150 or on a separate computing device remote from or connected to controller 150. Likewise, portions of the processing can be performed on different computing devices connected or unconnected to each other. Generally, the computing environment for the controller 150, positioner 152 or the other computing devices mentioned above can be implemented on a digital and/or analog computer. Although not required, portions of the controller 150, positioner 152 or the other computing devices mentioned above can be implemented at least in part, in the general context of computer-executable instructions, such as program modules, being executed by a computer 470 illustrated in FIG. 8. Generally, program modules include routine programs, objects, components, data structures, etc., which perform particular tasks or implement particular abstract data types. Those skilled in the art can implement the description herein as computer-executable instructions storable on a computer readable medium. Moreover, those skilled in the art will appreciate that the invention may be practiced with other computer system configurations, including multi-processor systems, networked personal computers, mini computers, main frame computers, and the like. Aspects of the invention may also be practiced in distributed computing environments where tasks are performed by remote processing devices that are linked through a communications network. In a distributed computer environment, program modules may be located in both local and remote memory storage devices.

The computer 470 comprises a conventional computer having a central processing unit (CPU) 472, memory 474 and a system bus 476, which couples various system components, including memory 474 to the CPU 472. The system bus 476 may be any of several types of bus structures including a memory bus or a memory controller, a peripheral bus, and a local bus using any of a variety of bus architectures. The memory 474 includes read only memory (ROM) and random access memory (RAM). A basic input/output (BIOS) containing the basic routine that helps to transfer information between elements within the computer 470, such as during start-up, is stored in ROM. Storage devices 478, such as a hard disk, a floppy disk drive, an optical disk drive, etc., are coupled to the system bus 476 and are used for storage of programs and data. It should be appreciated by those skilled in the art that other types of computer readable media that are accessible by a computer, such as magnetic cassettes, flash memory cards, digital video disks, random access memories, read only memories, and the like, may also be used as storage devices. Commonly, programs are loaded into memory 474 from at least one of the storage devices 478 with or without accompanying data.

Figure 8:
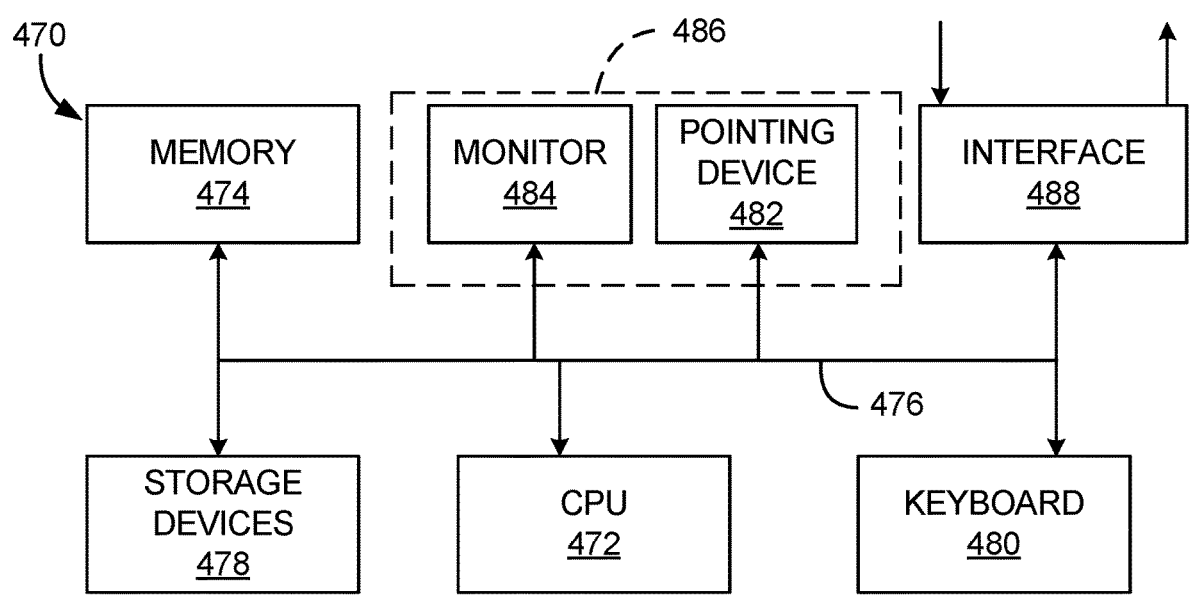
FIG. 8 is a schematic illustration of a computing environment.

Input devices such as a keyboard 480 and/or pointing device (mouse) 44, or the like, allow the user to provide commands to the computer 470. A monitor 484 or other type of output device is further connected to the system bus 476 via a suitable interface and provides feedback to the user. If the monitor 484 is a touch screen, the pointing device 82 can be incorporated therewith. The monitor 484 and typically an input pointing device 482 such as mouse together with corresponding software drivers form a graphical user interface (GUI) 486 for computer 470. Interfaces 488 on each of the controller 150, positioner 152 or other computing devices mentioned above allow communication between controller 150, positioner 152 and/or other computing devices mentioned above. Commonly, such circuitry comprises digital-to-analog (D/A) and analog-to-digital (A/D) converters as is well known in the art. Functions of controller 150 and/or positioner 152 can be combined into one computer system. In another computing environment, each of the controller 150 and/or positioner 152 is a single board computer operable on a network bus of another computer, such as a supervisory computer. The schematic diagram of FIG. 8 is intended to generally represent these and other suitable computing environments.

Although the subject matter has been described in language directed to specific environments, structural features and/or methodological acts, it is to be understood that the subject matter defined in the appended claims is not limited to the environments, specific features or acts described above as has been held by the courts. Rather, the environments, specific features and acts described above are disclosed as example forms of implementing the claims.

What is claimed is:

1. A system for processing a flexible part, comprising:
   a holder configured to hold the flexible part securely in a secured unconstrained processing position;
   an end effector configured to process the flexible part when held by the holder in the secured unconstrained processing position;
   at least one positioner configured to support the holder or the end effector for movement;
   a storage device storing specifications of the flexible part not in the secured unconstrained processing position stored on a computer readable medium of the storage device; and
   a controller configured to access the storage device to obtain information of the flexible part in a shape that is different than the secured unconstrained processing position, and to control the positioner to process the flexible part while in the secured unconstrained processing position by comparing a difference in shape due to a flexibility of the flexible part in the secured unconstrained processing position with a shape of the flexible part not in the secured unconstrained processing position when the flexible part has a different shape.

2. The system of claim 1 and a device configured to obtain the shape of the flexible part in the secured unconstrained processing position.

3. The system of claim 2 wherein the controller is configured to obtain data indicative of movements of the positioner based on a comparison of data indicative of the shape of the flexible part in the secured unconstrained processing position with data indicative of the shape of the flexible part not in the secured unconstrained processing position.

4. The system of claim 3 wherein the data indicative of the shape of the flexible part in the secured unconstrained processing position comprises scan frames and the data indicative of the shape of the flexible part not in the secured unconstrained processing position comprise reference frames.

5. The system of claim 4 wherein the scan frames and the reference frames comprise a geometric parameter with respect to a coordinate system.

6. The system of claim 5 wherein a difference between each of the associated reference and scan frames comprises a spatial difference.

7. The system of claim 6 wherein a unique matrix is obtained for each of the associated reference and scan frames.

8. The system of claim 7 wherein the controller is configured to control the positioner based on a set of unique matrices.

9. The system of claim 4 wherein the controller is configured to obtain at least one scan frame associated with a reference frame through interpolation between adjacent scan frames.

10. The system of claim 1 wherein the system comprises at least one of a drill, a mill, a scribing device or an inspecting device.

11. The system of claim 1 wherein the positioner is coupled to the end effector to control the movement thereof.

12. The system of claim 1 wherein the positioner is coupled to the holder to control the movement thereof.

13. The system of claim 4 wherein the difference in shape includes obtaining a plurality of scan frames, each scan frame corresponding to a different portion of the flexible part.

14. The system of claim 13 wherein the plurality of scan frames comprise a geometric parameter with respect to a coordinate system for at least one of a distance, an angle, an arc and a circle.

15. The system of claim 13 wherein each scan frame of the plurality of scan frames corresponds to a portion at a different position with respect to the flexible part along a reference direction.

16. The system of claim 13 wherein the controller is configured to control the positioner based on a comparison of one or more scan frames of the plurality of scan frames with one or more corresponding reference frames for one or more respective portions of the flexible part.

17. The system of claim 16 wherein the controller is configured to determine a control path to move the positioner.

18. The system of claim 17 wherein a spatial difference exists between each associated reference frame and scan frame for different portions of the flexible part.

19. The system of claim 16 wherein the difference in shape comprises obtaining at least one of an interpolated reference frame and an interpolated scan frame.

20. The system of claim 19 wherein the difference in shape comprises one or more of comparing the interpolated reference frame with an existing scan frame, comparing the interpolated scan frame with an existing reference frame or comparing the interpolated reference frame with the interpolated scan frame.

21. A system for processing a flexible part comprising:
a holder configured to hold the flexible part securely in unconstrained processing position;
an end effector configured to process the flexible part when held by the holder in the secured unconstrained processing position;
at least one positioner configured to support the holder or the end effector for movement;
a memory configured to store information of the flexible part in a shape that is different than the secured unconstrained processing position; and
a controller configured to access the memory to obtain the information of the flexible part in the shape that is different than the secured unconstrained processing position, and to process the flexible part with the end effector in the secured unconstrained processing position by controlling the positioner and the end effector based on a comparison of a difference in shape due to a flexibility of the flexible part in the secured unconstrained processing position with the information of the flexible part in the shape that is different than the secured unconstrained processing position.

22. The system of claim 21 wherein the system comprises at least one of a drill, a mill, a scribing device or an inspecting device.

23. The system of claim 21, wherein the information comprises design specifications of the flexible part.

24. The system of claim 23 wherein the difference in shape due to the flexibility of the flexible part in the secured unconstrained processing position comprises a plurality of scan frames, each scan frame corresponding to a different portion of the flexible part.

25. The system of claim 24 wherein the plurality of scan frames comprises one or more geometric parameters with respect to a coordinate system for at least one of a distance, an angle, an arc and a circle.

26. The system of claim 24 wherein each scan frame of the plurality of scan frames corresponds to a portion at a different position with respect to the flexible part along a reference direction.

27. The system of claim 24 and wherein the controller is configured to control the positioner based on a comparison of one or more scan frames of the plurality of scan frames with one or more reference frames based on the design specifications.

* * * * *